United States Patent [19]

Jonsson

[11] 4,165,533

[45] Aug. 21, 1979

[54] IDENTIFICATION OF A FAULTY ADDRESS DECODER IN A FUNCTION UNIT OF A COMPUTER HAVING A PLURALITY OF FUNCTION UNITS WITH REDUNDANT ADDRESS DECODERS

[75] Inventor: Björn E. R. Jonsson, Järfälla, Sweden

[73] Assignee: Telefonaktiebolaget L M Ericsson, Stockholm, Sweden

[21] Appl. No.: 865,534

[22] Filed: Dec. 29, 1977

[30] Foreign Application Priority Data

Jan. 28, 1977 [SE] Sweden ............................. 7700957

[51] Int. Cl.² .......................................... G06F 11/06
[52] U.S. Cl. .................................. 364/900; 235/307; 235/312
[58] Field of Search ... 364/900 MS File, 200 MS File; 235/307, 312

[56] References Cited

U.S. PATENT DOCUMENTS

| 3,177,468 | 4/1965 | Ruoff | 235/307 X |
| 3,476,922 | 11/1969 | Yiotis | 235/307 |
| 3,609,704 | 9/1971 | Schurter | 364/200 |

FOREIGN PATENT DOCUMENTS

386397  8/1973  U.S.S.R. ................................. 235/312

OTHER PUBLICATIONS

Bardsley et al., "Invalid Address Detector" in *IBM Technical Disclosure Bulletin*, vol. 9, No. 8, Jan. 1967, pp. 986-987.
Duke et al., "Fail-Safe Storage Cell" in *IBM Technical Disclosure Bulletin*, vol. 11, No. 10, Mar. 1969, pp. 1229-1230.
McMahon, "AC Test Procedure for Redundant Functional Islands" in *IBM Technical Disclosure Bulletin*, vol. 16, No. 11, Apr. 1974, p. 3597.
Iosupovicz, "Adaptive Universal Fault-Tolerant Logic Networks" in *IEEE Transactions on Computers*, Oct. 1975, pp. 1043-1048.

*Primary Examiner*—Melvin B. Chapnick
*Attorney, Agent, or Firm*—Hane, Roberts, Spiecens & Cohen

[57] ABSTRACT

A central control unit is connected via a common bus system to a number of function units, each of which being furnished with redundant address decoders in order to ensure reliable selection of the function units. If, in response to an address which is sent out by the control unit, a signal is emitted by only one of the two address decoders of a function unit, a recording is made in a memory device corresponding to that decoder to indicate an erroneous condition in one of the address decoders of the addressed function unit. If, on the other hand, signals are emitted by both address decoders a check signal is returned to the control unit, the absence of the check signal indicating that either one of the decoders belonging to the addressed function unit is faulty. Error recordings are read out from the respective memory device by subsequent addressing of the units, the read out from the memory device belonging to the one address decoder being effected by the signal emitted by the other decoder and vice versa.

5 Claims, 2 Drawing Figures

IDENTIFICATION OF A FAULTY ADDRESS DECODER IN A FUNCTION UNIT OF A COMPUTER HAVING A PLURALITY OF FUNCTION UNITS WITH REDUNDANT ADDRESS DECODERS

BACKGROUND OF THE INVENTION

The present invention relates to a method and an apparatus for identifying faulty address decoders belonging to function units which are connected via a common bus system connecting to a central control unit with a number of the function units, for safety reasons, being furnished with duplicated address decoders.

It is previously known from the U.S. Pat. No. 3,868,641, for example, to furnish function units with duplicated address decoders in order, thus, to achieve greater security against selection of an invalid unit. In said patent both decoders must operate simultaneously to give a reliable addressing indication. However, a decoder fault can show itself in such a manner that its detection is not obtained for the appropriate address or in such a manner that a detection is obtained for another or several other addresses. The fault can also be such that the decoder detects both the correct address and an invalid address. As long as only one of the decoders is impaired by a fault, erroneous selection is avoided because a signal is required from both of the decoders to insure that the associated function unit is actually addressed. Thus in case of no detection from one of the decoders the fault is immediately discovered as no response is obtained from the addressed unit. The apparatus of said patent can handle such faults. However when the fault is of that kind that an address is detected by a decoder which is not addressed, in addition to the decoders of the addressed function unit, it is necessary, however, to indicate the fault and its location in another way.

SUMMARY OF THE INVENTION

It is an object of the invention to make known the location of a faulty decoder by means of a minimum of signal paths between the central control unit and the function units. Briefly the invention contemplates a system including a number of addressable function units which are connected to a central control unit via a common bus system and, for safety reasons, are furnished with duplicated address decoders. There is provided an apparatus in each of the function units for identifying faulty address decoders operated upon addressing another of the function units. The apparatus includes an arrangement of logic circuits connected to the outputs of the two address decoders of each function unit and arranged to supply three indication signals. The first indication signal is given when only the first one of the two address decoders has detected a certain address being sent from the central control unit. The second indication signal is given when only the second one of the two address decoders has detected the certain address and a third indication signal is given when both of the two address decoders have detected the certain address. There is also included in the apparatus: first and second bistable recording means being set by the first and second indication signal, respectively; a first reading means controlled by the second one of the two address decoders for reading a recording made in the first recording means upon detection of the certain address; a second reading means controlled by the first one of the two address decoders for reading a recording made in the second recording means upon detection of the certain address; first and second output means for transferring to the common bus system the readings from the first and second reading means, respectively; and a third reading means connected to both of the address decoders for transferring to the common bus system the third indication signal when both address decoders are activated simultaneously but later than the first or second reading means if its associated recording means has been previously set due to a fault, the recording means having reset inputs connected to the output of the third reading means.

BRIEF DESCRIPTION OF THE DRAWING

The invention will be described below by means of an embodiment and with reference to the accompanying drawing according to which

DESCRIPTION OF THE PREFERRED EMBODIMENT

Figure 1:
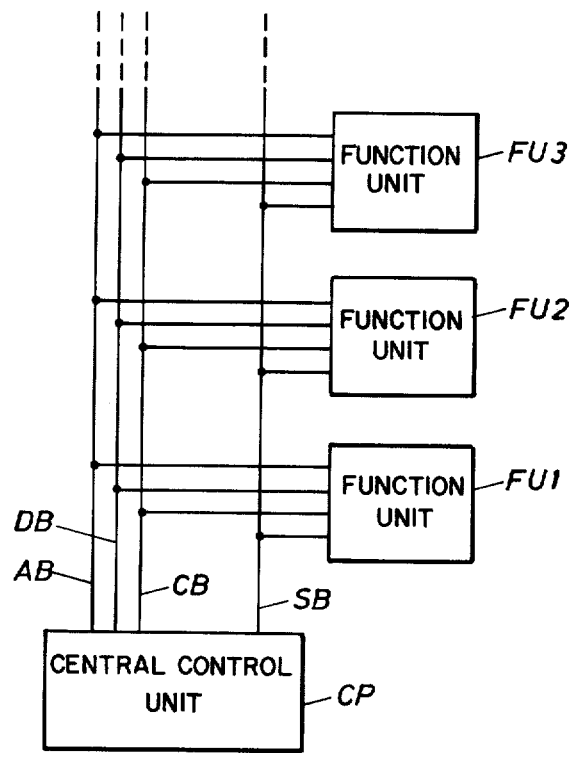
FIG. 1 is a block diagram of an installation including a central control unit and a plurality of function units in which the invention is utilized.

FIG. 1 shows an installation comprising a central control unit CP that co-operates with a number of function units FU1, FU2, FU3 etc which, according to the above, are furnished with redundant address decoders. On an address bus AB addresses are sent to the function units, according to, for example, a control program being stored in the central control unit. If an addressed function unit, for instance unit FU1, makes a correct detection, a check signal is emitted on a signal bus SB to the central control unit CP. After receiving the check signal, the central control unit CP can start data exchange with the function unit FU1 through a data bus DB, the synchronization of the units being obtained by means of clock signals on a clock bus CB. If one of the address decoders in the function unit FU1 does not detect the received address, the check signal does not arrive at the central control unit CP. Then the control unit CP can register this fact and, in a manner known per se, issue a fault indication. If, on the other hand, the address being sent to the function unit FU1, besides being correctly decoded in the intended unit, is also detected in one of the decoders in another function unit, for example FU2, the central control unit, according to the embodiment, does not immediately receive information about this fact, but can, due to the check signal received from the unit FU1, perform the intended data transfer. On the other hand a recording is made in a memory device in the function unit FU2 so that a fault indication can be received via the signal bus SB by the control unit CP in connection with a subsequent addressing of the unit FU2. As an alternative, the malfunction can be indicated to the central control unit CP immediately, but the identity of the erroneously indicating function unit can only be established in connection with an addressing of such function unit. Depending on the operating method of the installation it may be suitable to introduce special test routines whereby all function units are scanned regularly at determined intervals so that eventually, in dependence upon the scan, a fault indication is recorded in the central control unit CP. In order to distinguish such a scanning from normal addressing the address can be supplemented with an extra tag bit. This tag bit can then be used, for example, for switching-over the addressed function unit so that the data bus DB can be used for collecting miscellanous information about the function of the unit besides the mentioned address decoding function.

The addressing of the function units FU1, FU2, FU3 etc can be performed according to several principles. According to the already mentioned U.S. Pat. No. 3,868,641 each function unit is assigned two differently coded addresses each of which is transferred separately through a communication line. In order to obtain higher speed, it is necessary to transfer the addresses in parallel. In such case there is no reason to code the addresses differently. Within the scope of the invention it is also possible to connect the two address decoders of each function unit in parallel to the same bus wires. These different embodiments do not, however, change the design of the test circuits of the function units in principle.

Figure 2:
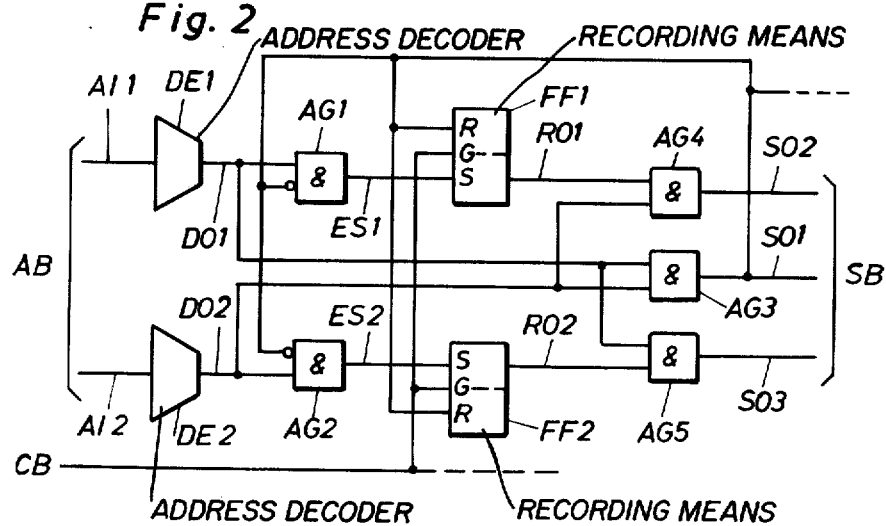
FIG. 2 is a schematic diagram of an embodiment of the invention which is incorporated in each of the function units of the installation.

FIG. 2 shows an example of how the test circuits of the function units may be constructed. Units DE1 and DE2 are the two address decoders which on their inputs AI1, AI2 receive addresses from the address bus AB according to one of the above mentioned principles and emit a detection signal on each of the outputs DO1, DO2. Units AG1 and AG2 are two AND-gates to indicate that either of the decoders alone detects a received address. A third AND-gate AG3 indicates that both decoders detect the address. The output SO1 of AND-gate AG3 emits a check signal to the signal bus SB as well as an inhibiting signal to an inverted input on each of the AND-gates AG1, AG2. Furthermore this signal is utilized internally in the function unit to activate it when being addressed. The outputs ES1, ES2 from the AND-gates AG1, AG2 are connected to the S-inputs of the bistable flip-flop FF1, FF2, respectively for recording the fault indications at the occurrence of a clock pulse which is supplied to the clock inputs G from the bus CB. When the address is correctly decoded, reset condition is, instead, supplied to the R inputs of the flip-flops from the AND-gate AG3. If a flip-flop is set this can be read off by means of the associated read gate AG4, or AG5 connected via lines RO1 and RO2 respectively to the outputs of the flip-flops. To activate these gates, each one is supplied with indication signals from the address decoder of the opposite side, i.e. there are cross connections between the address decoders DE1, DE2 and the gates AG5, AG4. There are two outputs SO2, SO3 from the gates AG4 and AG5 respectively to the signal bus SB.

If, when addressing a function unit, detection only occurs in one of the decoders of the function unit, for example in decoder DE1, but not in the decoder DE2, a high level is obtained on the output DO1 and a low level on the output DO2. Consequently, the output signal from the AND-gate AG3 becomes low. The AND-gate AG1 becomes activated and presents a high level output to the S-input of flip-flop FF1. Hence this flip-flop will be set by the clock pulse received by input G. No check signal is emitted on output SO1 to the bus SB, and therefore the central control unit CP is informed of the fact that the addressed unit is impaired by a fault. Repeated addressing of the same function unit causes no changes of the circuit state until the fault has been remedied.

If, when addressing a certain function unit, for example FU1, detection is performed in one of the address decoders, for example DE1, belonging to another function unit, for example FU2, than the intended one, the flip-flop FF1 in this unit FU2 will be set in the same manner as has been described in the previous example. A check signal is emitted on the output SO1 from the unit FU1 indicating that the address has been correctly decoded by the address decoders of unit FU1, but there is no indication at this time to the central control unit CP that a decoder in function unit FU2 has also erroneously detected this address. At a later time the function unit FU2 will be addressed by the central control unit CP whereby and it is assumed that the address will be detected at least by the decoder DE2, the one that did not erroneously detect the address for function unit FU1. As output DO2 of this decoder DE2 is connected to one of the inputs of gate AG4 the state of the flip-flop FF1 is read off onto the output SO2 and transferred to the central control unit CP to indicate that the addressed function unit is impaired by a fault. At the same time a check signal can be emitted from the same unit as FU2 because the fault which caused the decoder DE1 of that unit to detect the address of the unit FU1 can very well admit detection of its own address. In particular, decoder DE1 at this time decoders the address of unit FU1 causing output DO1 to go high and cooperate with the output DO2 at gate AG3 to emit the check signal on line SO1. In such a case, of course, the flip-flop FF1 will receive reset condition on its input R which is effected by means of a clock pulse on input G, during the presence of the signal on put SO1 at input R. This has no negative influence on the fault indication because that takes place before the reset.

As already mentioned, other embodiments are possible within the scope of the invention. If branchings, for example, are made from the two gate outputs DO1 and DO2 to the signal bus SB an immediate fault indication can be sent to the central control unit CP when a single-sided detection of an address is made in any one of the function units. The identification of the faulty unit, however, must be done by scanning. Then, as already mentioned, an extra tag bit may be added to the address to indicate testing. One may use an extra output from the address decoder DE1, DE2 corresponding to the tag bit in order to form, among other things, a special gate condition to the gates AG4, AG5 for reading off the flip-flops FF1, FF2.

We claim:

1. In a system including a number of addressable function units which are connected to a central control unit via a common bus system and, for safety reasons, are furnished with duplicated address decoders, an apparatus in each of said function units for identifying a faulty address decoder in one function unit which is operated when another function unit was actually addressed, said apparatus comprising in each function unit an arrangement of logic circuits being connected to the outputs of the two address decoders of the function unit and being arranged to supply three indication signals; a first indication signal when only the first one of said two address decoders has detected a certain address being sent from the central control unit, a second indication signal when only the second one of said two address decoders has detected said certain address and a third indication signal when both of said two address decoders have detected said certain address; first and second bistable recording means being set by said first and second indication signal, respectively; a first reading logic circuit controlled by the second one of said two address decoders for reading out a recording made in said first recording means upon detection of said certain address; a second reading logic circuit controlled by the first one of said two address decoders for reading out a recording made in said second recording means upon detection of said certain address; first and second output means for transferring to said common bus system the readings from said first and second reading logic circuits, respectively; and a third reading logic circuit connected to both of said address decoders for transferring to said common bus system said third indication signal when both address decoders are activated simultaneously but later than said first or second reading logic circuit if its associated recording means has been previously set due to a fault, said recording means having reset inputs connected to the output of said third reading logic circuit.

2. In a system including a plurality of addressable function units connected to a central control unit via a common bus system, each of the function units having a pair of redundant address decoders receiving addresses on the common bus system, the method of indicating that an address decoder in one function unit erroneously decoded the address of another function unit comprising, in any function unit, the steps of storing an indication when only one of the address decoders therein decodes an address, thereafter whenever the other of the address decoders decodes an address determining whether there is stored an indication that said one address decoder had previously decoded an address, and if said indication is stored, signalling the central control unit of such storage whereby the central control unit is informed that one of the address decoders in the function unit then being addressed had previously operated erroneously.

3. The method of claim 2 further comprising the step of cancelling the stored indication after said signalling step whenever both of the address decoders simultaneously decoded an address.

4. The method of claim 2 further comprising the step of signalling the central control unit when both of the address decoders simultaneously decode the same address.

5. The method of claim 3 further comprising the step of signalling the central control unit when both of the address decoders simultaneously decode the same address.

* * * * *